United States Patent
Jreji et al.

(10) Patent No.: US 9,477,295 B2
(45) Date of Patent: Oct. 25, 2016

(54) NON-VOLATILE MEMORY EXPRESS (NVME) DEVICE POWER MANAGEMENT

(71) Applicant: Dell Products, L.P., Round Rock, TX (US)

(72) Inventors: Elie Antoun Jreji, Pflugerville, TX (US); Austin P. Bolen, Austin, TX (US); Karthik V, Bangalore (IN)

(73) Assignee: DELL PRODUCTS, L.P., Round Rock, TX (US)

( * ) Notice: Subject to any disclaimer, the term of this patent is extended or adjusted under 35 U.S.C. 154(b) by 170 days.

(21) Appl. No.: 14/279,118

(22) Filed: May 15, 2014

(65) Prior Publication Data

US 2015/0331473 A1    Nov. 19, 2015

(51) Int. Cl.
| | | |
|---|---|---|
| G06F 1/32 | (2006.01) | |
| G06F 1/26 | (2006.01) | |
| G11C 5/14 | (2006.01) | |

(52) U.S. Cl.
CPC ............ *G06F 1/3275* (2013.01); *G06F 1/266* (2013.01); *G06F 1/3206* (2013.01); *G06F 1/3268* (2013.01); *G11C 5/14* (2013.01)

(58) Field of Classification Search
CPC ... G06F 11/3268; G06F 1/266; G06F 1/3206
See application file for complete search history.

(56) References Cited

U.S. PATENT DOCUMENTS

| | | | | |
|---|---|---|---|---|
| 7,788,516 B2 * | 8/2010 | Conroy | ...................... | G06F 1/26 713/300 |
| 7,908,503 B2 * | 3/2011 | Mizuno | .................. | G06F 3/0625 711/112 |
| 8,843,700 B1 * | 9/2014 | Salessi | ................ | G06F 12/0246 711/103 |
| 2005/0285639 A1 * | 12/2005 | Chen | ........................ | G06F 1/26 327/143 |
| 2008/0177424 A1 * | 7/2008 | Wheeler | ............... | G06F 1/3203 700/295 |
| 2010/0100757 A1 * | 4/2010 | Takada | .................. | G06F 1/3221 713/340 |
| 2010/0241888 A1 * | 9/2010 | Kaneko | ................. | G06F 1/3203 713/324 |
| 2013/0111243 A1 * | 5/2013 | Barnette | ................... | G06F 1/28 713/323 |
| 2013/0179624 A1 * | 7/2013 | Lambert | ............ | G06F 12/0246 711/103 |
| 2013/0332753 A1 * | 12/2013 | Varma | ...................... | G06F 1/26 713/300 |
| 2015/0309752 A1 * | 10/2015 | Ellis | ...................... | G06F 3/0625 711/103 |
| 2015/0331473 A1 * | 11/2015 | Jreji | ...................... | G06F 1/3268 713/320 |

OTHER PUBLICATIONS

Intelligent Platform Management Interface. Apr. 15, 2013 [retrieved on Dec. 15, 2015]. Wikipedia. Retrieved from the Internet:<URL: https://web.archive.org/web/20130415152501/http://en.wikipedia.org/wiki/Intelligent_Platform_Management_Interface>.*

* cited by examiner

*Primary Examiner* — Nitin Patel
*Assistant Examiner* — Kevin Stewart
(74) *Attorney, Agent, or Firm* — Fogarty, L.L.C.

(57) ABSTRACT

Systems and methods for managing power to Non-Volatile Memory Express (NVMe) devices. In some embodiments, an Information Handling System (IHS) may include a Central Processing Unit (CPU); a Non-Volatile Memory Express (NVMe) device operably coupled to the CPU; a service processor operably coupled to the CPU and to the NVMe; and a memory operably coupled to the service processor, the memory including program instructions stored thereon that, upon execution by the service processor, cause the service processor to: receive performance data from the CPU, receive metrics data from a source other than the CPU, and control an amount of power provided to the NVMe device based, at least in part, upon the performance data and the metrics data.

17 Claims, 2 Drawing Sheets

NON-VOLATILE MEMORY EXPRESS (NVME) DEVICE POWER MANAGEMENT

FIELD

This disclosure relates generally to computer systems, and more specifically, to systems and methods for managing power to Non-Volatile Memory Express (NVMe) devices.

BACKGROUND

As the value and use of information continues to increase, individuals and businesses seek additional ways to process and store information. One option is an Information Handling System (IHS). An IHS generally processes, compiles, stores, and/or communicates information or data for business, personal, or other purposes. Because technology and information handling needs and requirements may vary between different applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, global communications, etc. In addition, IHSs may include a variety of hardware and software components that may be configured to process, store, and communicate information and may include one or more computer systems, data storage systems, and networking systems.

A hard disk drive (HDD) is a data storage device used for storing and retrieving digital information in an IHS, and a solid-state drive (SSD) is a special type of HDD that uses integrated circuit assemblies as memory to store data persistently. In many situations, SSD technology uses electronic interfaces compatible with traditional HDDs, including, for example, the Peripheral Component Interconnect Express (PCIe), which is a high-speed serial computer expansion bus standard. As PCIe SSD technology becomes standardized, these types of devices are becoming more generally known as Non-Volatile Memory express (NVMe) devices.

The inventors hereof have recognized that PCIe SSDs provide much higher read/write performance than conventional HDDs. However, an SSD's power consumption is quite considerable (typically around 25 W). Moreover, an SSD's power consumption for write operations is relatively high compared to read operations. When an SDD device power is throttled, the write performance drops, but not the read performance. Thus, the inventors hereof have developed systems and methods for smartly managing the power provided to PCIe SSDs for achieving the bigger goal of optimizing an IHS' power consumption by dynamically regulating power to these devices depending upon input/output (I/O) workloads.

SUMMARY

Embodiments of systems and methods for managing power to Non-Volatile Memory Express (NVMe) devices are described herein. In an illustrative, non-limiting embodiment, an Information Handling System (IHS) may include a Central Processing Unit (CPU); a Non-Volatile Memory Express (NVMe) device operably coupled to the CPU; a service processor operably coupled to the CPU and to the NVMe; and a memory operably coupled to the service processor, the memory including program instructions stored thereon that, upon execution by the service processor, cause the service processor to: receive performance data from the CPU, receive metrics data from a source other than the CPU, and control an amount of power provided to the NVMe device based, at least in part, upon the performance data and the metrics data.

For example, the NVMe may include a Peripheral Component Interconnect Express (PCIe) solid-state drive (SSD). The service processor may include a Baseboard Management Controller (BMC). The performance data may include an aggregated read/write volume of root ports in a PCIe bus. Additionally or alternatively, the performance data may include a status of a free running counter. Additionally or alternatively, the performance data may include bandwidth utilization. Moreover, the metrics data may include a metric provided by an application executed by the CPU, the metric indicative of a number of read and write operations performed by the application. Additionally or alternatively, the metrics data may include an overall power budget of the IHS. Additionally or alternatively, the metrics data may include a read and write statistic of the NVMe device obtained via a Management Component Transport Protocol (MCTP) interface. Additionally or alternatively, the metrics data may include a time of the day.

In some embodiments, to control the amount of power, the program instructions may be configured to cause the service processor to put a limit, via a sideband or out-of-band channel, upon a maximum amount of power that can be drawn by the NVMe device. Additionally or alternatively, the program instructions may be configured to cause the service processor to determine that it is in charge of managing power provided to the NVMe device based upon a Basic Input/Output System (BIOS) token.

In another illustrative, non-limiting embodiment, a method may include receiving performance data from a CPU, receiving metrics data from a source other than the CPU, and controlling, via a sideband or out-of-band channel, an amount of power provided to a NVMe device operably coupled to the CPU based, at least in part, upon the performance data and the metrics data.

In some cases, the NVMe may include a PCIe SSD coupled to the CPU via a PCIe bus, and the service processor includes a BMC. The performance data may include two or more of: an aggregated read/write volume of root ports in a PCIe bus, a status of a free running counter, or bandwidth utilization. The metrics data may include two or more of: a metric provided by an application executed by the CPU, the metric indicative of a number of read and write operations performed by the application, an overall power budget, a read and write statistic of the NVMe device obtained via an MCTP interface, or a time of the day. Further, controlling the amount of power may include limiting a maximum amount of power that can be drawn by the NVMe device based upon a BIOS indication.

In yet another illustrative, non-limiting embodiment, a non-transitory computer-readable medium may have program instructions stored thereon that, upon execution by a BMC within an IHS, cause the BMC to: receive performance data from a CPU; receive metrics data from a source other than the CPU; and control, via a sideband or out-of-band channel, an amount of power provided to a PCIe SSD operably coupled to the CPU based, at least in part, upon the performance data and the metrics data.

In some implementations, the performance data and the metrics data may include the following components: random read, sequential read, random write, and sequential write. Also, these components may be weighed such that the sequential read component has twice the weight of the random read component, the sequential write component may have twice the weight of the random read component, and the random write component may have five times the weight of the random read component.

In some embodiments, one or more of the techniques described herein may be performed, at least in part, by an IHS operated by a given one of a plurality of participants of a virtual collaboration session. In other embodiments, these techniques may be performed by an IHS having a processor and a memory coupled to the processor, the memory including program instructions stored thereon that, upon execution by the processor, cause the IHS to execute one or more operations. In yet other embodiments, a non-transitory computer-readable medium may have program instructions stored thereon that, upon execution by an IHS, cause the IHS to execute one or more of the techniques described herein.

BRIEF DESCRIPTION OF THE DRAWINGS

The present invention(s) is/are illustrated by way of example and is/are not limited by the accompanying figures, in which like references indicate similar elements. Elements in the figures are illustrated for simplicity and clarity, and have not necessarily been drawn to scale.

DETAILED DESCRIPTION

In various embodiments, systems and methods for managing power to a Non-Volatile Memory Express (NVMe) device may be implemented in an Information Handling System (IHS) in order to reduce the device's power usage with minimal or no effect on the IHS' performance. These systems and methods may be implemented, at least in part, via a service processor coupled to a Central Processing Unit (CPU) using data provided by the CPU and/or from other sources within the IHS.

Examples of NVMe devices include, but are not limited to, Peripheral Component Interconnect Express (PCIe) solid-state drives (SSDs). As used herein, the term "SSD" refers to a data storage device that employs integrated circuit assemblies as memory to store data persistently. Generally speaking, SSDs have no moving mechanical components in contrast with traditional electromechanical magnetic disks such as hard disk drives (HDDs). In some cases, hybrid drives or solid state hybrid drives (SSHD) combine the features of SSDs and HDDs in the same unit, containing a large hard disk drive and an SSD cache to improve performance of frequently accessed data. Thus, in certain situations, hybrid drives may also take advantage of systems and methods described herein.

Service processors may include Baseboard Management Controllers (BMCs) or the like. A BMC is a specialized processor, controller, or circuit configured to monitor the state of an IHS, network server or other hardware device, such as its temperature, humidity, power-supply voltage, fan speeds, communications parameters and/or operating system (OS) functions. In some cases, if one or more of these variables is outside specified limits, an administrator may be notified through an independent network connection and/or corrective may be taken, often remotely and/or independently. An example of BMC includes, but is not limited to the Integrated Dell® Remote Access Controller (iDRAC) service processor.

Examples of CPUs include, but not limited to, Intel® processors such as, for example, processors following the Haswell and/or Broadwell architectures. In some cases, a CPU may include registers that provide usage data for CPU, memory, and/or Peripheral Component Interconnect (PCI) subsystems. This data can be accessed by the BMC through the Platform Environment Control Interface (PECI) bus or can be obtained from the Manageability Engine (ME) firmware with Power Thermal Aware Scheduling (PTAS) Compute Usage Per Second (CUPS) capability. Typically, the ME is embedded in the chipset.

Figure 1:
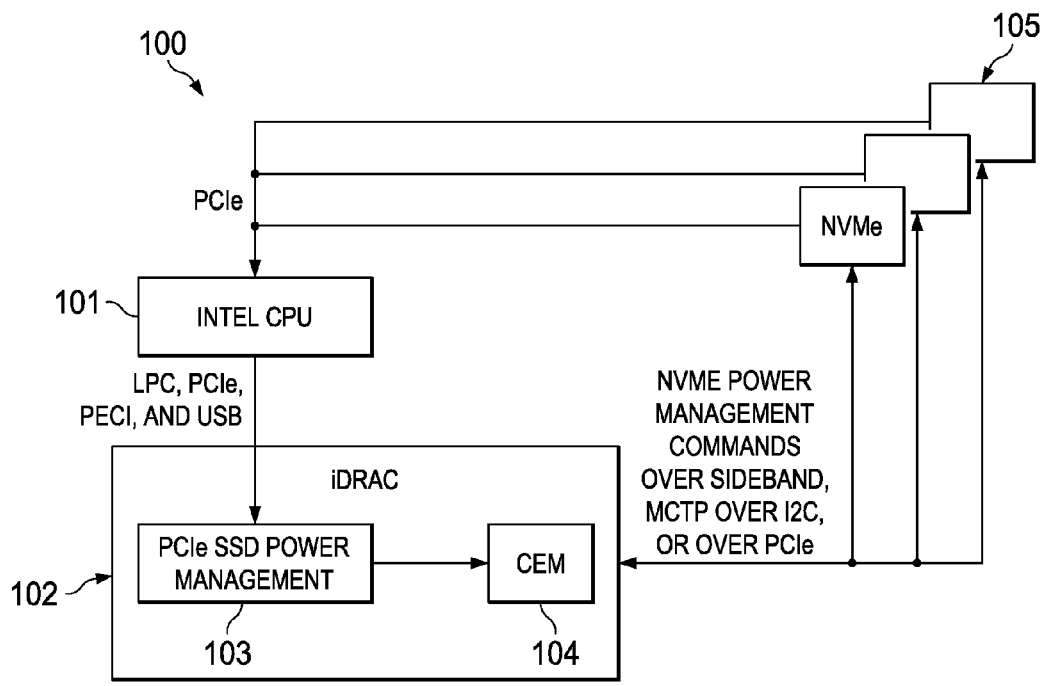
FIG. 1 is a diagram illustrating an example of an environment where systems and methods for managing power to Non-Volatile Memory Express (NVMe) devices may be implemented according to some embodiments.

Turning now to FIG. 1, a diagram illustrating an example of environment 100 where systems and methods for managing power to Non-Volatile Memory Express (NVMe) devices may be implemented is depicted. As shown, CPU 101 is coupled to service processor 102 via several interfaces (Low Pin Count or LPC, Universal Serial Bus or USB, PCIe, and/or PECI) and to an array of PCIe SSDs 105 via a Management Component Transport Protocol (MCTP) interface. The MCTP protocol is defined to use several sideband interfaces, including Inter-Integrated Circuit (I2C) and PCIe buses. The I2C bus is directly connected between the BMC and the PCIe SSDs, whereas PCIe is forwarded through CPU 101.

In some embodiments, service processor 102 may communicate with each of PCIe SSDs 105 via a sideband channel or bus, for example, utilizing a System Management Bus (SMBUS) interface between the BMC and a Network Interface Controller (NIC). Additionally or alternatively, service processor 102 may communicate with each of PCIe SSDs 105 via an out-of-band (OOB) channel, which involves the use of a dedicated management channel for device maintenance. As such service processor 102 may issue power management commands, gather SSD data, etc. using sideband and/or OOB communications.

Service processor 102 (e.g., iDRAC) may include PCI Express (PCIe) SSD power management block 103 coupled to Comprehensive Embedded Management (CEM) block 104. CEM block 104 may include instructions configure to talk to peripheral devices via sideband and to manage and/or monitor those peripherals. In operation, power management block 103 includes and/or executes instructions that allow service processor 102 to receive performance data from CPU 101 as well as metrics data from a source other than CPU 101, such as, for example from PCIe SSD(s) 105. Power management block 103 also includes and/or executes instructions that control an amount of power provided to any given one of PCIe SSD(s) 105 based upon performance data and/or metrics data. In some cases, CEM may receive a command from power management block 103 and may execute that command by communicating with corresponding ones of PCIe SSD(s) 105 over a sideband channel or bus. The command may set, for example, a maximum amount of power that can be drawn by PCIe SSD(s) 105 in light of the collected data.

Examples of performance data received from CPU 101 include, but are not limited to an aggregated read/write volume of root ports in the PCIe bus, free running counters visible via PECI or the ME, and/or bandwidth utilization calculated on total available minus used.

In addition to the new registers available from CPU 101, other metrics data may be used to get a more complete picture of the power requirements and determine when it is safe to reduce power to the PCIe SSD 105. Such metrics may include, but are not limited to, I/O usage, CPU, and memory statistics that are obtained from the CPU (either through the ME or directly through the PECI bus). For example, low I/O usage for the PCI slots containing PCIe SSD drives is an indication that power allocation to the drives can be reduced. Metrics data may also include applications running on the server obtained from a software agent such as the iDRAC Service Module (ISM). These applications are allocated a score based on the read and write operations they use. Yet other metrics data may include the overall power budget of the server, read and write statistics from the SSD drive through the MCTP interface, and the time of the day when SSD I/O activity is high or low; which may be programmed by the user or automatically inferred based on statistics.

In some embodiments, not all performance and metrics data are needed, and service processor 102 makes decisions based on the all or fewer than all possible data available. When an IHS is running predominantly read operations (based on application type or running statistics), or when there is low I/O activity, PCIe SSD(s) 105 can be put into a low power state without affecting the server performance. Instructions stored in power management block 103 may be configured to capture data for various workload requirements and power policies of the IHS. Based on the data provided, service processor 102 may issue NVMe power management commands via the MCTP sideband interface to configure the power state of a given PCIe SSD 105, thus forming a control/feedback loop.

In some embodiments, instructions stored in power management block 103 may also include a mechanism to determine the source of NVMe power management (i.e., CPU 101 or "in-band," or service processor 102 or "sideband"). For example, Basic I/O System (BIOS) tokens may enable power management of SSD 105 via service processor 102 or CPU 101. This feature provides a user with flexibility to choose to either manage the device power from CPU 101 or service processor 102 at any point in time. Additionally or alternatively, a sideband command may be used to instruct PCIe SSD 105 to accept power management commands via CPU 101 or service processor 102.

Figure 2:
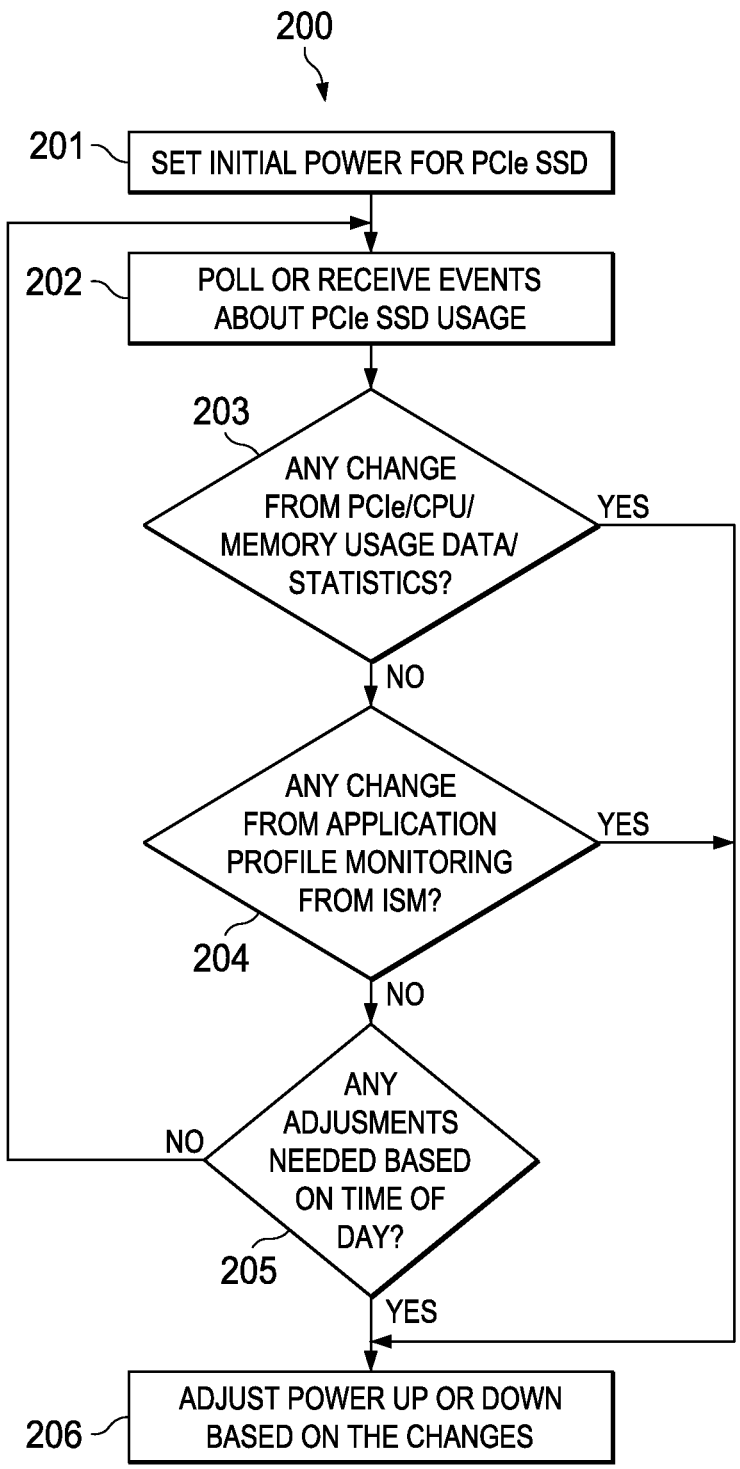
FIG. 2 is a flowchart of an example of a method for managing power to NVMe devices according to some embodiments.

FIG. 2 is a flowchart of method 200 for managing power to NVMe devices 105. In some embodiments, method 200 may be performed, at least in part, by service processor 102 of FIG. 1. At block 201, method 200 includes setting an initial power limit for one or more PCIe SSDs 105. At block 202, method 200 includes polling and/or receiving events about PCIe SSD 105 usage, for example, in the form of performance data received from CPU 101 and/or metrics data received from other sources within an IHS.

At blocks 203-206, method 200 includes determining whether there has been any change from PCIe/CPU/Memory usage data or statistics, whether there has been any change from an application profile monitoring from the ISM, or whether any adjustments are needed based on a time of day, respectively. If so, the power provided to PCIe SSDs 105 may be adjusted up or down based on the changes at block 206. Otherwise control returns to block 202.

At block 206, a mathematical calculation may be performed to assign weights to the various performance and metrics data received by service processor 102. In some cases a weighed average may be taken of two or more statistics or measurements, and the result may be mapped to a power control value or limit either directly or via a look-up table. For example, a first weight may be assigned to the aggregated read/write volume of root ports in the PCIe bus, as received from CPU 101, a second weight may be assigned to the volume of I/O usage for the PCI slots, as collected from a bus controller, and a third weight may be assigned to a volume of read and write operations recorded by a software application. The weighed average of these various data may provide a value (e.g., between 0 and 10), which is then mapped to a power cap for a given SSD drive (e.g., between 0 and 100%). For instance, in the previous example, if the result of the weight average is 5, then the SSD device may be limited drawing up to 50% of the total available power.

Additionally or alternatively, service processor 102 may determine the I/O workload currently being run on a given PCIe SSD. The workload may have a number of components such as, for example, the components indicated in Table I below:

TABLE I

| Workload | Relative Power Consumption | Abbreviation |
| --- | --- | --- |
| Random Read | X | IORR |
| Sequential Read | 2X | IOSR |
| Random Write | 5X | IORW |
| Sequential Write | 2X | IOSW |

In some implementations, using the foregoing components, a limiting factor may be calculated in the form of a weighted average as follows: Limiting factor=[(IOSR)*$^2$/$_{10}$+ (IORR)*$^1$/$_{10}$+(IORW)*$^5$/$_{10}$+$^2$/$_{10}$*(IORW)]/[IORR+IOSR+ IORW+IOSW]. Then, the total power actually provided to a PCIe SSD may be given by the total power available to the SSD, multiplied by the limiting factor. As a person of ordinary skill in the art will recognize in light of this disclosure, however, in alternative embodiments other components may be used and different weights may be applied to each component.

For purposes of this disclosure, an IHS may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an IHS may be a personal computer (e.g., desktop or laptop), tablet computer, mobile device (e.g., Personal Digital Assistant (PDA) or smart phone), server (e.g., blade server or rack server), a network storage device, or any other suitable device and may vary in size, shape, performance, functionality, and price. An IHS may include Random Access Memory (RAM), one or more processing resources such as a Central Processing Unit (CPU) or hardware or software control logic, Read-Only Memory (ROM), and/or other types of nonvolatile memory.

Additional components of an IHS may include one or more disk drives, one or more network ports for communicating with external devices as well as various I/O devices, such as a keyboard, a mouse, touchscreen, and/or a video display. An IHS may also include one or more buses operable to transmit communications between the various hardware components.

Figure 3:
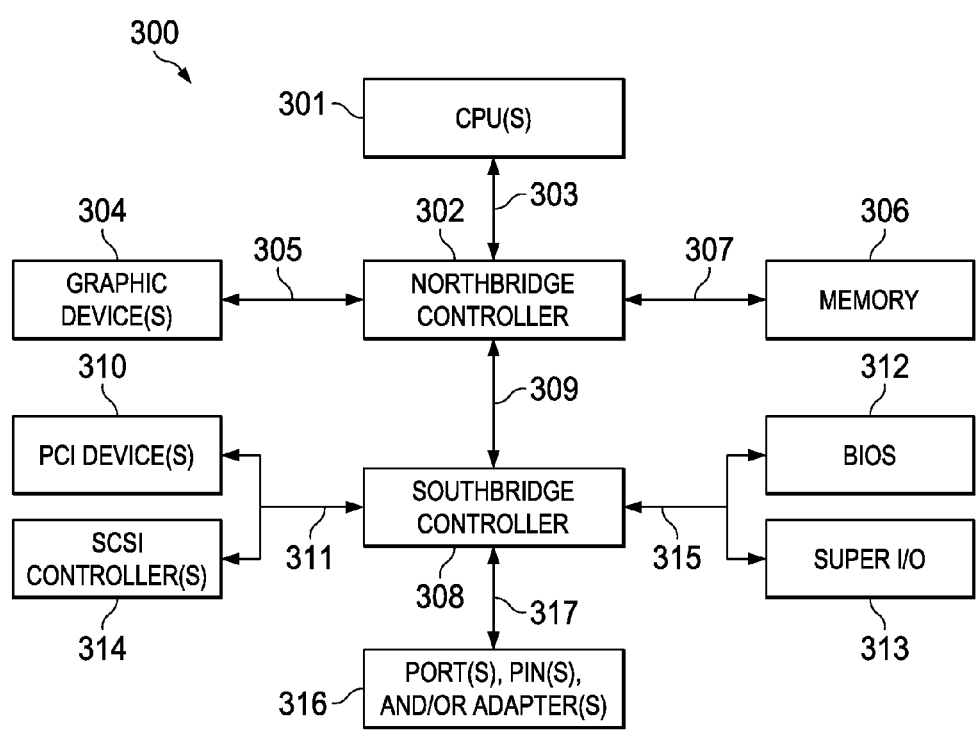
FIG. 3 is a block diagram of an example of an Information Handling System (IHS) according to some embodiments.

FIG. 3 is a block diagram of an example of an IHS. In some embodiments, IHS 300 may be used to implement environment 100 of FIG. 1. As shown, IHS 300 includes one or more CPUs 301. In various embodiments, IHS 300 may be a single-processor system including one CPU 301, or a multi-processor system including two or more CPUs 301 (e.g., two, four, eight, or any other suitable number). CPU(s) 301 may include any processor capable of executing program instructions. For example, in various embodiments, CPU(s) 301 may be general-purpose or embedded processors implementing any of a variety of Instruction Set Architectures (ISAs), such as the x86, POWERPC®, ARM®, SPARC®, or MIPS® ISAs, or any other suitable ISA. In multi-processor systems, each of CPU(s) 301 may commonly, but not necessarily, implement the same ISA.

CPU(s) 301 are coupled to northbridge controller or chipset 301 via front-side bus 303. Northbridge controller 302 may be configured to coordinate I/O traffic between CPU(s) 301 and other components. For example, in this particular implementation, northbridge controller 302 is coupled to graphics device(s) 304 (e.g., one or more video cards or adaptors) via graphics bus 305 (e.g., an Accelerated Graphics Port or AGP bus, a Peripheral Component Interconnect or PCI bus, or the like). Northbridge controller 302 is also coupled to system memory 306 via memory bus 307. Memory 306 may be configured to store program instructions and/or data accessible by CPU(s) 301. In various embodiments, memory 306 may be implemented using any suitable memory technology, such as static RAM (SRAM), synchronous dynamic RAM (SDRAM), nonvolatile/Flash-type memory, or any other type of memory.

Northbridge controller 302 is coupled to southbridge controller or chipset 308 via internal bus 309. Generally speaking, southbridge controller 308 may be configured to handle various of IHS 300's I/O operations, and it may provide interfaces such as, for instance, USB, audio, serial, parallel, Ethernet, or the like via port(s), pin(s), and/or adapter(s) 316 over bus 317. For example, southbridge controller 308 may be configured to allow data to be exchanged between IHS 300 and other devices, such as other IHSs attached to a network (e.g., network 104). In various embodiments, southbridge controller 308 may support communication via wired or wireless general data networks, such as any suitable type of Ethernet network, for example; via telecommunications/telephony networks such as analog voice networks or digital fiber communications networks; via storage area networks such as Fiber Channel SANs; or via any other suitable type of network and/or protocol.

Southbridge controller 308 may also enable connection to one or more keyboards, keypads, touch screens, scanning devices, voice or optical recognition devices, or any other devices suitable for entering or retrieving data. Multiple I/O devices may be present in IHS 300. In some embodiments, I/O devices may be separate from IHS 300 and may interact with IHS 300 through a wired or wireless connection. As shown, southbridge controller 308 is further coupled to one or more PCI devices 310 such as SSDs 105 of FIG. 1 as well as any number of other PCI devices (e.g., modems, network cards, sound cards, or video cards), and to one or more SCSI controllers 314 via parallel bus 311. Southbridge controller 308 is also coupled to BIOS 312 and to Super I/O Controller 313 via LPC bus 315.

BIOS 312 includes non-volatile memory having program instructions stored thereon. Those instructions may be usable CPU(s) 301 to initialize and test other hardware components and/or to load an Operating System (OS) onto IHS 300. Super I/O Controller 313 combines interfaces for a variety of lower bandwidth or low data rate devices. Those devices may include, for example, floppy disks, parallel ports, keyboard and mouse, temperature sensor and fan speed monitoring/control, among others.

In some cases, IHS 300 may be configured to provide access to different types of computer-accessible media separate from memory 306. Generally speaking, a computer-accessible medium may include any tangible, non-transitory storage media or memory media such as electronic, magnetic, or optical media—e.g., magnetic disk, a hard drive, a CD/DVD-ROM, a Flash memory, etc. coupled to IHS 300 via northbridge controller 302 and/or southbridge controller 308.

In some embodiments, service processor 102 of FIG. 1 may be implemented in IHS 300 as a distinct or discrete component coupled to southbridge controller 308 via the PCI bus. In other embodiments, service processor 102 may be mounted on a motherboard and coupled to northbridge controller similarly as one of CPU(s) 301; although still as a distinct or discrete component.

The terms "tangible" and "non-transitory," as used herein, are intended to describe a computer-readable storage medium (or "memory") excluding propagating electromagnetic signals; but are not intended to otherwise limit the type of physical computer-readable storage device that is encompassed by the phrase computer-readable medium or memory. For instance, the terms "non-transitory computer readable medium" or "tangible memory" are intended to encompass types of storage devices that do not necessarily store information permanently, including, for example, RAM. Program instructions and data stored on a tangible computer-accessible storage medium in non-transitory form may afterwards be transmitted by transmission media or signals such as electrical, electromagnetic, or digital signals, which may be conveyed via a communication medium such as a network and/or a wireless link.

A person of ordinary skill in the art will appreciate that IHS 300 is merely illustrative and is not intended to limit the scope of the disclosure described herein. In particular, any computer system and/or device may include any combination of hardware or software capable of performing certain operations described herein. In addition, the operations performed by the illustrated components may, in some embodiments, be performed by fewer components or distributed across additional components. Similarly, in other embodiments, the operations of some of the illustrated components may not be performed and/or other additional operations may be available.

For example, in some implementations, northbridge controller 302 may be combined with southbridge controller 308, and/or be at least partially incorporated into CPU(s) 301. In other implementations, one or more of the devices or components shown in FIG. 3 may be absent, or one or more other components may be added. Accordingly, systems and methods described herein may be implemented or executed with other IHS configurations.

It should be understood that various operations described herein may be implemented in software executed by logic or processing circuitry, hardware, or a combination thereof. The order in which each operation of a given method is performed may be changed, and various operations may be added, reordered, combined, omitted, modified, etc. It is intended that the invention(s) described herein embrace all such modifications and changes and, accordingly, the above description should be regarded in an illustrative rather than a restrictive sense.

Although the invention(s) is/are described herein with reference to specific embodiments, various modifications and changes can be made without departing from the scope of the present invention(s), as set forth in the claims below. Accordingly, the specification and figures are to be regarded in an illustrative rather than a restrictive sense, and all such modifications are intended to be included within the scope of the present invention(s). Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements. The terms "coupled" or "operably coupled" are defined as connected, although not necessarily directly, and not necessarily mechanically. The terms "a" and "an" are defined as one or more unless stated otherwise. The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a system, device, or apparatus that "comprises," "has," "includes" or "contains" one or more elements possesses those one or more elements but is not limited to possessing only those one or more elements. Similarly, a method or process that "comprises," "has," "includes" or "contains" one or more operations possesses those one or more operations but is not limited to possessing only those one or more operations.

The invention claimed is:

1. An Information Handling System (IHS), comprising:
a Central Processing Unit (CPU);
a Non-Volatile Memory Express (NVMe) device operably coupled to the CPU;
a service processor operably coupled to the CPU and to the NVMe; and
a memory operably coupled to the service processor, the memory including program instructions stored thereon that, upon execution by the service processor, cause the service processor to:
receive performance data from the CPU, the performance data including an aggregated read/write volume of root ports in a PCIe bus;
receive metrics data from a source other than the CPU, the metrics data including a volume of input/output (I/O) usage for a PCI slot collected from a bus controller and a volume of read and write operations recorded by a software application;
assign a respective weight to the performance data and to each of metrics data; and
control an amount of power provided to the NVMe device, at least in part, by calculating a weighed average of the performance data and the metrics data using the respective weights, and mapping the weighed average to a power cap for the NVMe device.

2. The IHS of claim 1, wherein the NVMe includes a Peripheral Component Interconnect Express (PCIe) solid-state drive (SSD).

3. The IHS of claim 1, wherein the service processor includes a Baseboard Management Controller (BMC).

4. The IHS of claim 1, wherein the performance data includes a status of a free running counter.

5. The IHS of claim 1, wherein the performance data includes bandwidth utilization.

6. The IHS of claim 1, wherein the metrics data includes an overall power budget of the IHS.

7. The IHS of claim 1, wherein the metrics data includes a read and write statistic of the NVMe device obtained via a Management Component Transport Protocol (MCTP) interface.

8. The IHS of claim 1, wherein the metrics data includes a time of the day.

9. The IHS of claim 1, wherein to control the amount of power the program instructions are configured to cause the service processor to put a limit, via a sideband or out-of-band channel, upon a maximum amount of power that can be drawn by the NVMe device.

10. The IHS of claim 1, wherein to control the amount of power the program instructions are configured to cause the service processor to determine that it is in charge of managing power provided to the NVMe device based upon a Basic Input/Output System (BIOS) token.

11. A method, comprising:
receiving performance data from a Central Processing Unit (CPU), the performance data including an aggregated read/write volume of root ports in a PCIe bus;
receiving metrics data from a source other than the CPU, the metrics data including a volume of input/output (I/O) usage for a PCI slot collected from a bus controller and a volume of read and write operations recorded by a software application;
assigning a respective weight to each of the performance data and the metrics data; and
controlling, via a sideband or out-of-band channel, an amount of power provided to a Non-Volatile Memory Express (NVMe) device operably coupled to the CPU, at least in part, by calculating a weighed average of the performance data and the metrics data using the respective weights, and mapping the weighed average to a power cap for the NVMe device.

12. The method of claim 11, wherein the NVMe includes a Peripheral Component Interconnect Express (PCIe) solid-state drive (SSD) coupled to the CPU via a PCIe bus, and wherein the service processor includes a Baseboard Management Controller (BMC).

13. The method of claim 11, wherein the performance data includes a status of a free running counter or bandwidth utilization.

14. The method of claim 11, wherein the metrics data further includes an overall power budget, a read and write statistic of the NVMe device obtained via a Management Component Transport Protocol (MCTP) interface, or a time of the day.

15. The method of claim 11, wherein controlling the amount of power includes limiting a maximum amount of power that can be drawn by the NVMe device based upon a Basic Input/Output System (BIOS) indication.

16. A non-transitory computer-readable medium having program instructions stored thereon that, upon execution by a Baseboard Management Controller (BMC) within an Information Handling System (IHS), cause the BMC to:
determine an input/output (I/O) workload running on a given Peripheral Component Interconnect Express (PCIe) solid-state drive (SSD), the I/O workload including a random read operation, a sequential read operation, a random write operation, and a sequential write operation;
assign a respective weight to each given operation of the I/O workload indicating a relative power consumption of the given operation with respect to a power consumption of the random read operation; and
control, via a sideband or out-of-band channel, an amount of power provided to the PCIe SSD, at least in part, by calculating a weighed average of the operations using the respective weights, and multiplying a total power available to the PCIe SSD by the weighed average.

17. The non-transitory computer-readable medium of claim 16, wherein the components are weighed such that the sequential read component has twice the weight of the random read component, the sequential write component has twice the weight of the random read component, and the random write component has five times the weight of the random read component.

* * * * *